(12) United States Patent
Yang et al.

(10) Patent No.: US 11,127,782 B2
(45) Date of Patent: Sep. 21, 2021

(54) MAGNETIC MEMORY ARRAY INCORPORATING SELECTORS AND METHOD FOR MANUFACTURING THE SAME

(71) Applicant: Avalanche Technology, Inc., Fremont, CA (US)

(72) Inventors: Hongxin Yang, Newark, CA (US); Bing K. Yen, Cupertino, CA (US)

(73) Assignee: Avalanche Technology, Inc., Fremont, CA (US)

( * ) Notice: Subject to any disclaimer, the term of this patent is extended or adjusted under 35 U.S.C. 154(b) by 405 days.

(21) Appl. No.: 16/024,601

(22) Filed: Jun. 29, 2018

(65) Prior Publication Data

US 2020/0006422 A1 Jan. 2, 2020

(51) Int. Cl.
*H01L 27/22* (2006.01)
*H01L 43/12* (2006.01)
*H01L 43/02* (2006.01)
*H01L 43/10* (2006.01)

(52) U.S. Cl.
CPC .......... *H01L 27/222* (2013.01); *H01L 43/02* (2013.01); *H01L 43/12* (2013.01); *H01L 43/10* (2013.01)

(58) Field of Classification Search
CPC ......... H01L 27/224; H01L 27/226–228; H01L 27/222–228; H01L 43/08; G11C 2213/70–82
See application file for complete search history.

(56) References Cited

U.S. PATENT DOCUMENTS

| 2014/0209892 | A1  | 7/2014 | Kuo et al.              |
|--------------|-----|--------|-------------------------|
| 2014/0254245 | A1* | 9/2014 | Tadepalli ...... G06F 12/0246 |
|              |     |        | 365/148                 |
| 2016/0020250 | A1  | 1/2016 | Li et al.               |
| 2017/0148851 | A1* | 5/2017 | Hsu ............... H01L 27/11514 |

* cited by examiner

*Primary Examiner* — Amar Movva
(74) *Attorney, Agent, or Firm* — Bing K. Yen

(57) ABSTRACT

The present invention is directed to a memory cell array comprising an array of magnetic memory elements arranged in rows and columns; a plurality of electrodes, each of which is formed adjacent to a respective one of the array of magnetic memory elements; a plurality of first conductive lines, each of which is connected to a respective row of the array of magnetic memory elements along a row direction; and a plurality of composite lines. Each composite line includes a volatile switching layer connected to a respective column of the plurality of electrodes along a column direction; an electrode layer formed adjacent to the volatile switching layer; and a second conductive line formed adjacent to the electrode layer. The dimension of the volatile switching layer may be substantially larger than the size of the magnetic memory element along the row direction.

11 Claims, 13 Drawing Sheets

MAGNETIC MEMORY ARRAY INCORPORATING SELECTORS AND METHOD FOR MANUFACTURING THE SAME

BACKGROUND

The present invention relates to magnetic memory, and more particularly, to a magnetic memory cell structure and a method for manufacturing the same.

A resistance-based memory device normally comprises an array of memory cells, each of which includes a memory element and a selection element coupled in series between two electrodes. The selection element functions like a switch to direct current or voltage through the selected memory element coupled thereto. The selection element may be a three-terminal device, such as transistor, or a two-terminal device, such as diode or Ovonic threshold switch. Upon application of an appropriate voltage or current to the selected memory element, the electrical resistance of the memory element would change accordingly, thereby switching the stored logic in the respective memory cell.

FIG. 1 is a schematic circuit diagram for a memory array 30 incorporating therein two-terminal selectors as selection elements. The memory array 30 comprises a plurality of memory cells 32, each of which includes a two-terminal bi-directional selector 34 coupled to a resistance-based non-volatile memory element 36 in series; a plurality of parallel first conductive lines 38 with each being coupled to a respective row of the two-terminal bi-directional selectors 34 in a first direction; and a plurality of parallel second conductive lines 40 with each being coupled to a respective row of the memory elements 36 in a second direction substantially perpendicular to the first direction. Accordingly, the memory cells 32 are located at the cross points between the first and second conductive lines 38 and 40. The first and second conductive lines 38 and 40 may be bit lines and word lines, respectively, or vice versa. Multiple layers of the memory array 30 may be stacked on a substrate to form a monolithic three-dimensional memory device.

The resistance-based memory element 36 may be classified into at least one of several known groups based on the resistance switching mechanism. The memory element of Phase Change Random Access Memory (PCRAM) may comprise a phase change chalcogenide compound, which can switch between a resistive phase (amorphous or crystalline) and a conductive crystalline phase. The memory element of Conductive Bridging Random Access Memory (CBRAM) relies on the statistical bridging of metal rich precipitates therein for its switching mechanism. The memory element of CBRAM normally comprises a nominally insulating metal oxide material, which can switch to a lower electrical resistance state as the metal rich precipitates grow and link to form conductive paths or filaments upon application of an appropriate voltage. The memory element of Magnetic Random Access Memory (MRAM) normally includes a magnetic reference layer and a magnetic free layer with an electron tunnel junction layer interposed therebetween. The magnetic reference layer, the electron tunnel junction layer, and the magnetic free layer collectively form a magnetic tunneling junction (MTJ). When a switching current or voltage is applied to the MTJ, the magnetization direction of the magnetic free layer is switched with respect to the magnetization direction of the magnetic reference layer, thereby changing the electrical resistance of the MTJ.

When the magnetization directions of the magnetic free and reference layers are substantially parallel or oriented in a same direction, electrons polarized by the magnetic reference layer can tunnel through the insulating tunnel junction layer, thereby decreasing the electrical resistance of the MTJ. Conversely, the electrical resistance of the MTJ is high when the magnetization directions of the magnetic reference and free layers are substantially anti-parallel or oriented in opposite directions. The stored logic in the magnetic memory element can be switched by changing the magnetization direction of the magnetic free layer between parallel and anti-parallel configurations with respect to the magnetization direction of the reference layer. Therefore, the MTJ has two stable resistance states that allow the MTJ to serve as a non-volatile memory element.

The two-terminal bi-directional selector 34 normally includes two electrodes with a volatile switching layer interposed therebetween. The volatile switching layer is insulative in the absence of an applied voltage or voltage bias to the selector 34. When a sufficiently high voltage is applied to the selector 34, however, the volatile switching layer becomes conductive and thus allows current to flow therethrough. Therefore, the selector 34 is a volatile device that requires the continuing application of a voltage to be conductive.

FIG. 2 illustrates the formation of a magnetic memory cell 32 by a conventional manufacturing method. The magnetic memory cell 32 includes a selector 34 and a magnetic memory element 36 coupled in series. The selector 34 includes a top electrode 42 and a bottom electrode 44 with a volatile switching layer 46 interposed therebetween. The magnetic memory element 36 includes a magnetic tunnel junction (MTJ) structure 48 between an optional seed layer 50 and an optional cap layer 52. The selector 34 is formed on top of the magnetic memory element 36, which is formed on top of the first conductive line 40 (bit or word line).

With continuing reference to FIG. 2, the fabrication of the magnetic memory cell 32 begins by depositing all relevant films of the magnetic memory element 36 and the selector 34 on a planarized substrate containing therein the first conductive line 40. The pillar shaped magnetic memory cell 32 is then formed by etching the relevant films with an etch mask 52 thereon. The etching process can carried out by plasma etching or ion beam etching. Because of the weak etching resistance of the volatile switching layer 46 compared with other layers in the magnetic memory cell 32 and the prolonged exposure of the volatile switching layer 46 to the etching environment, the sidewall of the volatile switching layer 46 tends to recede from the sidewalls of the adjacent layers, thereby creating a circumferential notch or cavity on the pillar shaped magnetic memory cell 32. During the etching process, redeposited materials, such as magnetic materials from the MTJ structure 48 and noble metals from the top and bottom electrodes 42 and 44 that cannot be readily volatilized, may accumulate in the circumferential notch, thereby shunting the selector 34.

For the foregoing reasons, there is a need for a manufacturing method that can reliably produce magnetic memory cells with high yield.

SUMMARY

The present invention is directed to a memory cell array and corresponding manufacturing method that satisfy this need. A memory array having features of the present invention comprises an array of magnetic memory elements arranged in rows and columns; a plurality of electrodes, each of which is formed adjacent to a respective one of the array of magnetic memory elements; a plurality of first conductive lines, each of which is connected to a respective row of the array of magnetic memory elements along a row direction; and a plurality of composite lines. Each composite line includes a volatile switching layer connected to a respective column of the plurality of electrodes along a column direction; an electrode layer formed adjacent to the volatile switching layer; and a second conductive line formed adjacent to the electrode layer. The dimension of the volatile switching layer may be substantially larger than the size of the magnetic memory element along the row direction.

According to another aspect of the present invention, a memory array comprises an array of magnetic memory elements arranged in rows and columns; a plurality of electrodes, each of which is formed adjacent to a respective one of the array of magnetic memory elements; a plurality of first conductive lines, each of which is connected to a respective row of the array of magnetic memory elements along a row direction; a sheet of volatile switching layer formed adjacent to the plurality of electrodes; and a plurality of composite lines formed adjacent to the sheet of volatile switching layer. Each composite line includes an electrode layer aligned to a respective column of the array of magnetic memory elements along a column direction and a second conductive line formed adjacent to the electrode layer.

According to still another aspect of the present invention, a method for manufacturing a memory array comprising the steps of depositing a first conductive film layer on top of a substrate; patterning the first conductive film layer into a plurality of first conductive lines extending along a first direction; forming an array of magnetic memory elements imbedded in an insulating matrix on top of the plurality of first conductive lines; depositing a volatile switching film layer on top of the array of magnetic memory elements; depositing a top electrode film layer and a second conductive film layer on top of the volatile switching film layer; forming an etch mask on top of the second conductive film layer that includes a plurality of parallel lines aligned to the array of magnetic memory elements along a second direction substantially perpendicular to the first direction; and etching at least the second conductive film layer and the top electrode film layer with the etch mask thereon.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

Where reference is made herein to a material AB composed of element A and element B, the material AB can be an alloy, a compound, or a combination thereof, except where the context excludes that possibility.

Where reference is made herein to a method comprising two or more defined steps, the defined steps can be carried out in any order or simultaneously, except where the context excludes that possibility, and the method can include one or more other steps which are carried out before any of the defined steps, between two of the defined steps, or after all the defined steps, except where the context excludes that possibility.

The term "noncrystalline" means an amorphous state or a state in which fine crystals are dispersed in an amorphous matrix, not a single crystal or polycrystalline state. In case of state in which fine crystals are dispersed in an amorphous matrix, those in which a crystalline peak is substantially not observed by, for example, X-ray diffraction can be designated as "noncrystalline."

The term "magnetic dead layer" means a layer of supposedly ferromagnetic material that does not exhibit a net magnetic moment in the absence of an external magnetic field. A magnetic dead layer of several atomic layers may form in a magnetic film in contact with another layer material owing to intermixing of atoms at the interface. Alternatively, a magnetic dead layer may form as thickness of a magnetic film decreases to a point that the magnetic film becomes superparamagnetic.

The term "at least" followed by a number is used herein to denote the start of a range beginning with that number, which may be a range having an upper limit or no upper limit, depending on the variable being defined. For example, "at least 1" means 1 or more than 1. The term "at most" followed by a number is used herein to denote the end of a range ending with that number, which may be a range having 1 or 0 as its lower limit, or a range having no lower limit, depending upon the variable being defined. For example, "at most 4" means 4 or less than 4, and "at most 40%" means 40% or less than 40%. When, in this specification, a range is given as "a first number to a second number" or "a first number-a second number," this means a range whose lower limit is the first number and whose upper limit is the second number. For example, "25 to 100 nm" means a range whose lower limit is 25 nm and whose upper limit is 100 nm.

One way to minimize the accumulation of redeposited materials on the sidewall of the volatile switching layer of the selector is to fabricate the selector and the magnetic memory element separately. Embodiments of the present invention as applied to formation of a magnetic memory array will now be described with reference to FIGS. 3-19.

Figure 1:
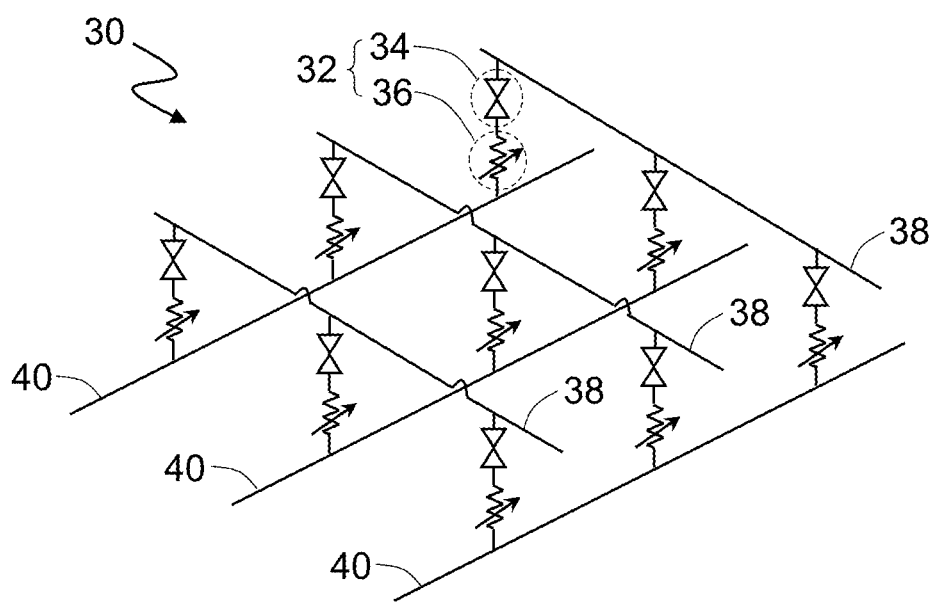
FIG. 1 is a schematic circuit diagram for an array of memory cells, each of which includes a two-terminal selector and a memory element coupled in series between a word line and a bit line.
Figure 2:
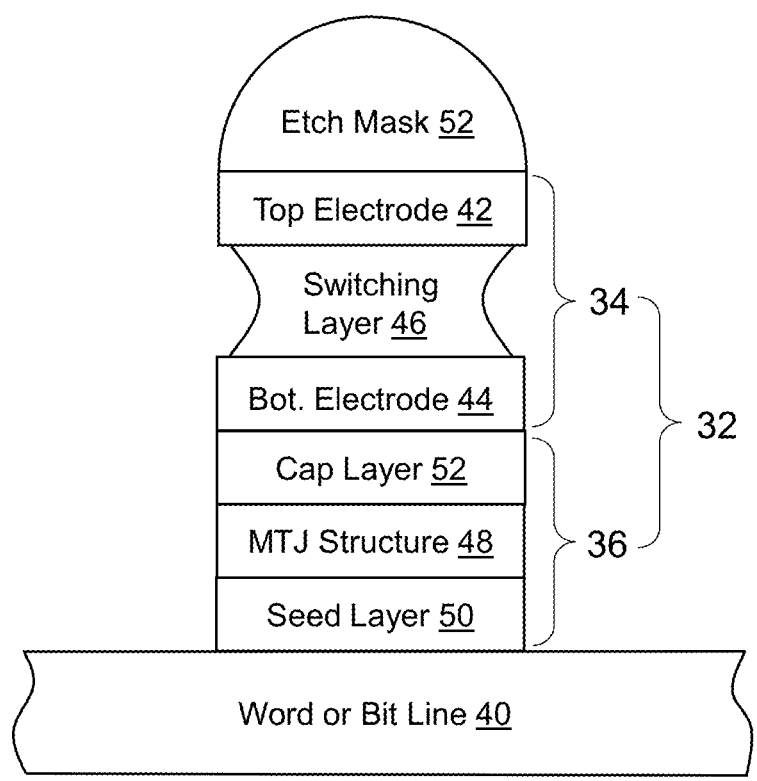
FIG. 2 is a cross-sectional view of a magnetic memory cell after etching.
Figure 3:
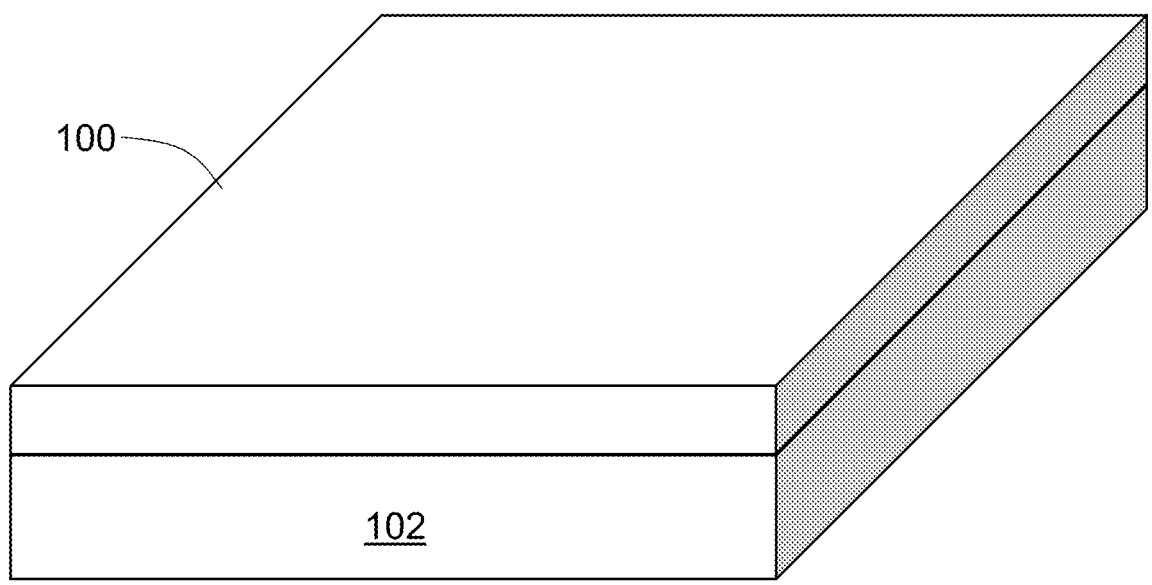
FIGS. 3-13 and 15-17 are perspective views illustrating various stages in formation of an array of memory cells in accordance with an embodiment of the present invention.

Referring now to FIG. 3, the process begins by first depositing a conductive film layer 100 on top of a substrate 102. The conductive film layer 100 may be deposited by a physical vapor deposition (PVD) process (e.g., sputtering) or a chemical vapor deposition (CVD) process (e.g., plasma enhanced CVD, atomic layer deposition) and may be made of any suitable conductor, such as but not limited to tungsten (W), titanium nitride ($TiN_x$), aluminum (Al), tantalum (Ta), tantalum nitride ($TaN_x$), copper nitride ($CuN_x$), ruthenium (Ru), copper (Cu) or any combination thereof.

Figure 4:
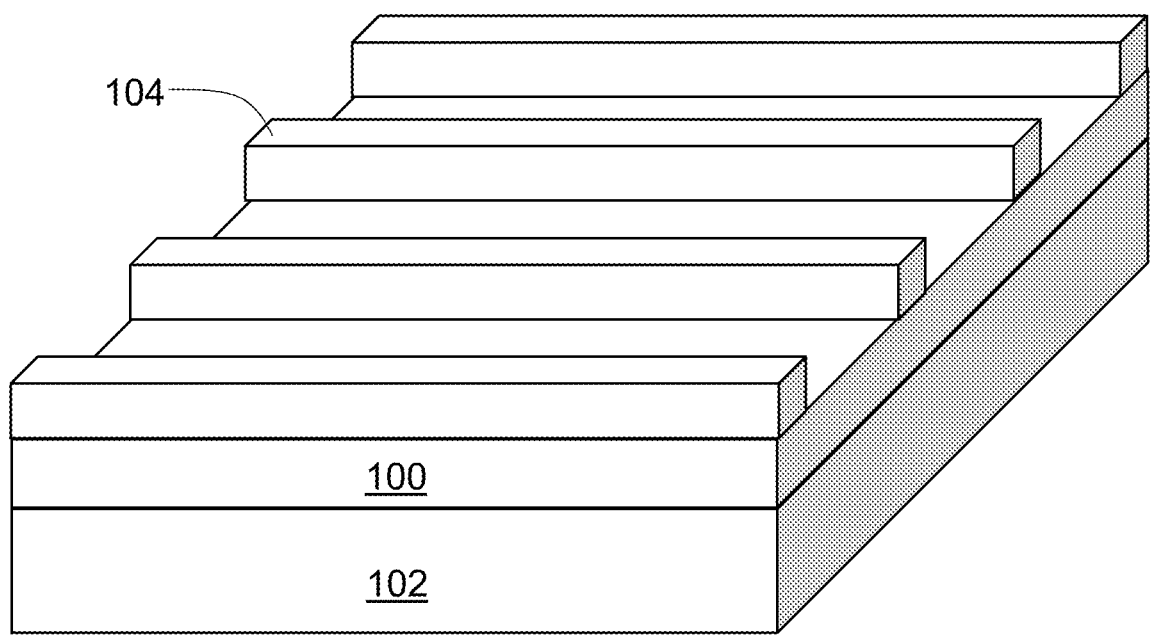

Following the deposition of the conductive film layer 100, an etch mask 104 comprising a plurality of parallel lines is formed on top of the conductive film layer 100 as illustrated in FIG. 4. The etch mask 104 may include one or more layers of mask materials, such as but not limited to photoresist, silicon oxide ($SiO_x$), silicon nitride ($SiN_x$), silicon oxynitride ($SiO_xN_y$), silicon carbide ($SiC_x$), tantalum (Ta), tantalum nitride ($TaN_x$), tungsten (W), titanium nitride ($TiN_x$), and any combinations thereof. The etch mask 104 may be formed by photolithography or a combination of photolithography and etching.

Figure 5:
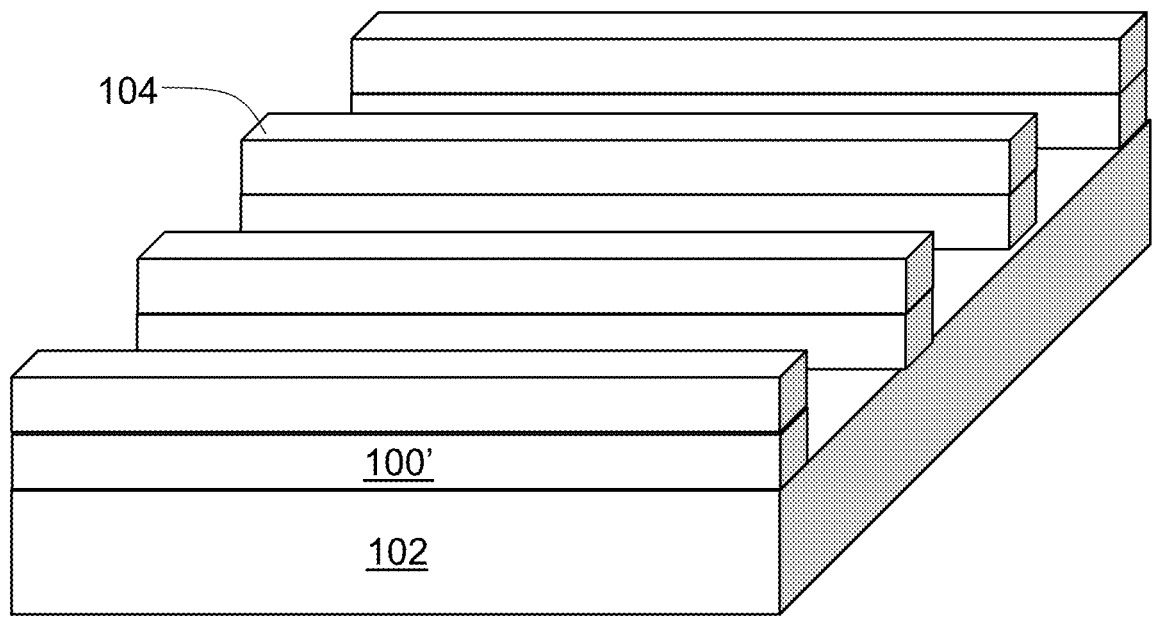
Figure 6:
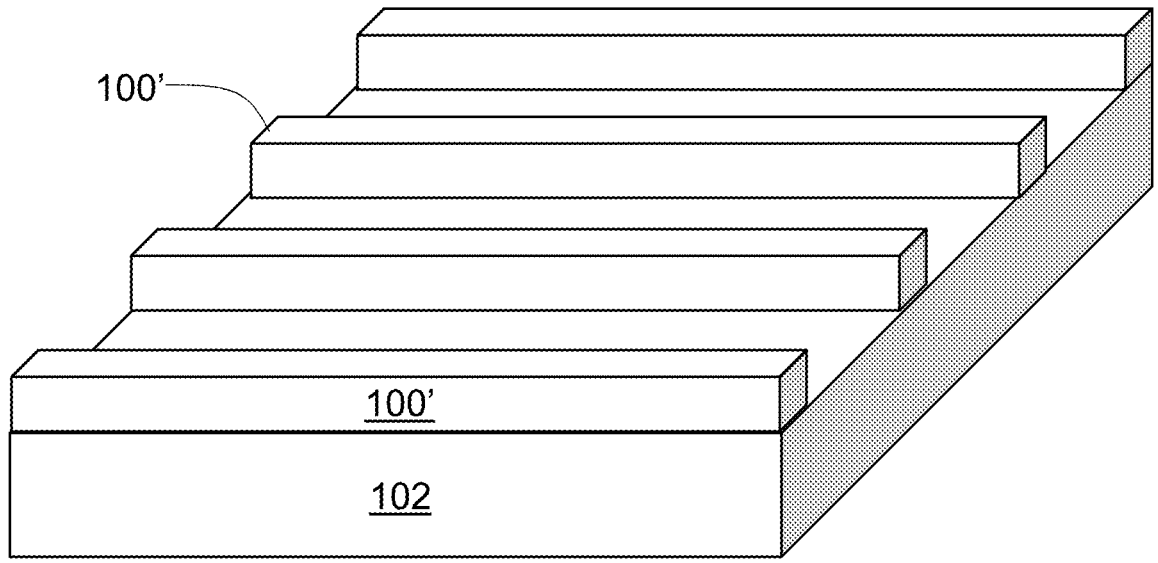

The fabrication process continues by etching the conductive film layer 100 with the etch mask 104 thereon to form a plurality of first conductive lines 100' extending along a first direction on the substrate 102 as illustrated in FIG. 5. The etching process, which may be carried out by a plasma etching process (e.g., reactive ion etching) or an ion beam etching process or a combination of both, removes portions of the conductive film layer 100 not covered by the etch mask 104. After the etching process, the etch mask 104 is removed from the top of the first conductive lines 100' as shown in FIG. 6.

Figure 7:
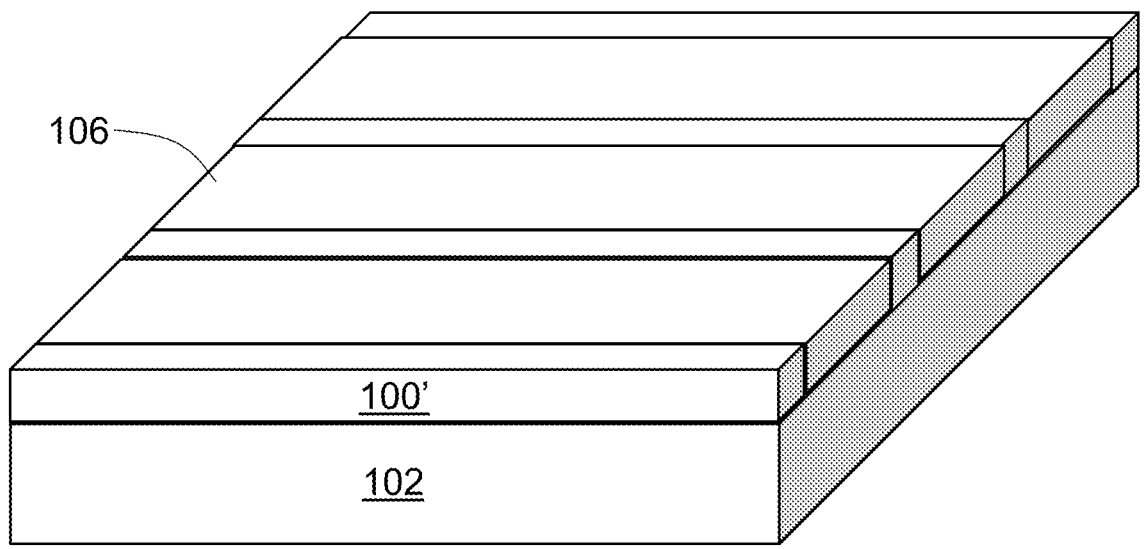

After the formation of the first conductive lines 100', a first dielectric material is deposited onto the substrate 102 and the first conductive lines 100', and followed by a planarization process to remove excess first dielectric material above the first conductive lines 100' to form a first interlayer dielectric (ILD) 106 as shown in FIG. 7. The deposition of the first dielectric material may be carried out by a PVD or CVD process. The planarization process may be carried out by chemical mechanical polishing (CMP). The structure shown in FIG. 7 may alternatively be fabricated by a damascene process, in which the first dielectric material is first deposited onto the substrate 102 and then followed by etching of a line pattern in the layer of first dielectric material and filling of line pattern with a conductor to form the first conductive lines 100'.

Figure 8:
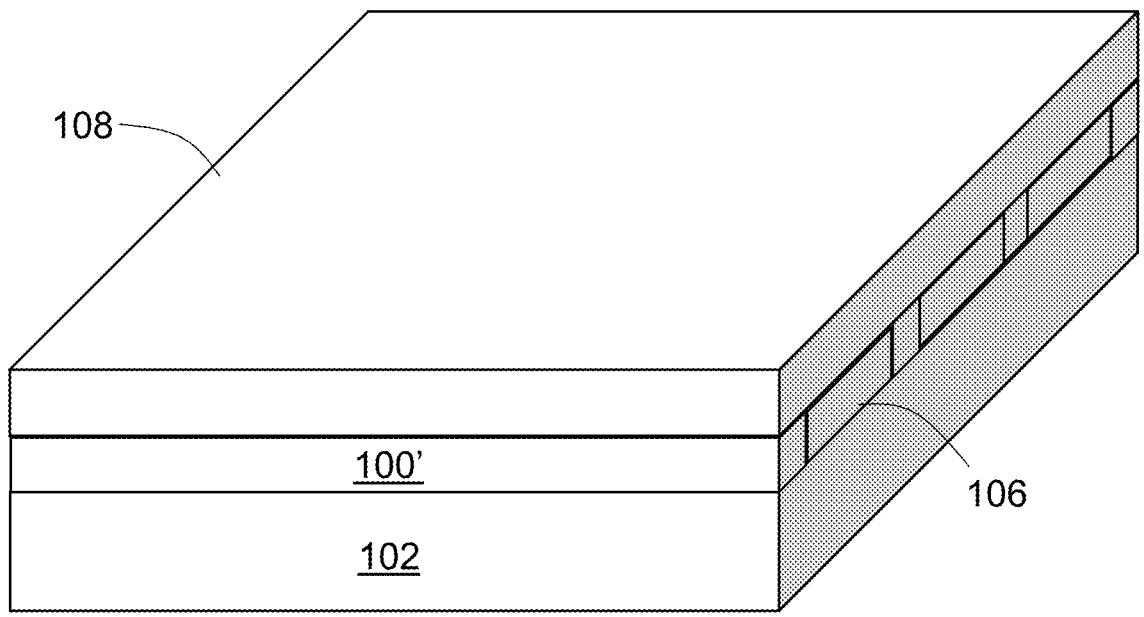

Following the planarization process, a magnetic memory element film stack 108 is deposited on the first conductive lines 100' and the first ILD 106 as shown in FIG. 8. The magnetic memory element film stack 108 includes at least two magnetic film layers with an insulating tunnel junction film layer interposed therebetween (not shown). Each of the two magnetic film layers may include cobalt (Co), iron (Fe), and boron (B). The insulating tunnel junction film layer may be made of magnesium oxide ($MgO_x$), aluminum oxide ($AlO_x$), titanium oxide ($TiO_x$), or any combination thereof. The magnetic memory element film stack 108 may optionally include one or more conductive film layers on top that serve as the bottom electrode for the selectors to be formed above the magnetic memory element film stack 108. Each of the one or more conductive film layers may be made of a suitable conductor, such as but not limited to Cu, $CuGe_x$, Ni, Ag, Pt, Pd, Cr, Co, Fe, Al, Au, Ir, Ru, Ti, $TiN_x$, Ta, $TaN_x$, W, $WN_x$, Mo, $MoN_x$, Zr, $ZrN_x$, Hf, $HfN_x$, Nb, $NbN_x$, Zn, or any combination thereof. For example and without limitation, the bottom electrode film structure may comprise a layer of Ag and a layer of $TiN_x$ formed thereon.

Instead of being deposited directly on top of the first conductive lines 100' and the first ILD 106 as shown in FIG. 8, the magnetic memory element film stack 108 may alternatively be deposited on another ILD layer (not shown) with intermediate contacts imbedded therein above the first conductive lines 100'. The intermediate contacts on top of the first conductive lines 100' may be fabricated by a damascene process.

Figure 9:
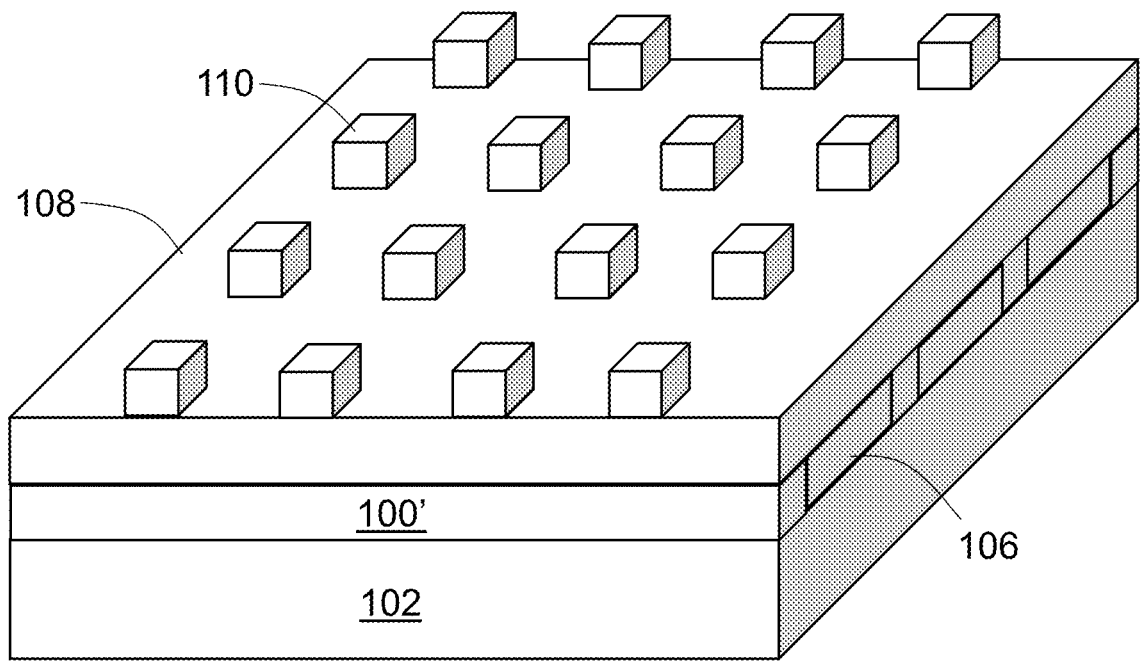

The fabrication process continues by forming an etch mask 110 comprising a plurality of pillars on top of the magnetic memory element film stack 108 as illustrated in FIG. 9. The mask pillars are aligned to the first conductive lines 100' beneath or the intermediate contacts if present. The etch mask 110 may include one or more layers of mask materials, such as but not limited to photoresist, silicon oxide ($SiO_x$), silicon nitride ($SiN_x$), silicon oxynitride ($SiO_xN_y$), silicon carbide ($SiC_x$), tantalum (Ta), tantalum nitride ($TaN_x$), tungsten (W), titanium nitride ($TiN_x$), and any combinations thereof. The etch mask 110 may be formed by photolithography or a combination of photolithography and etching.

Figure 10:
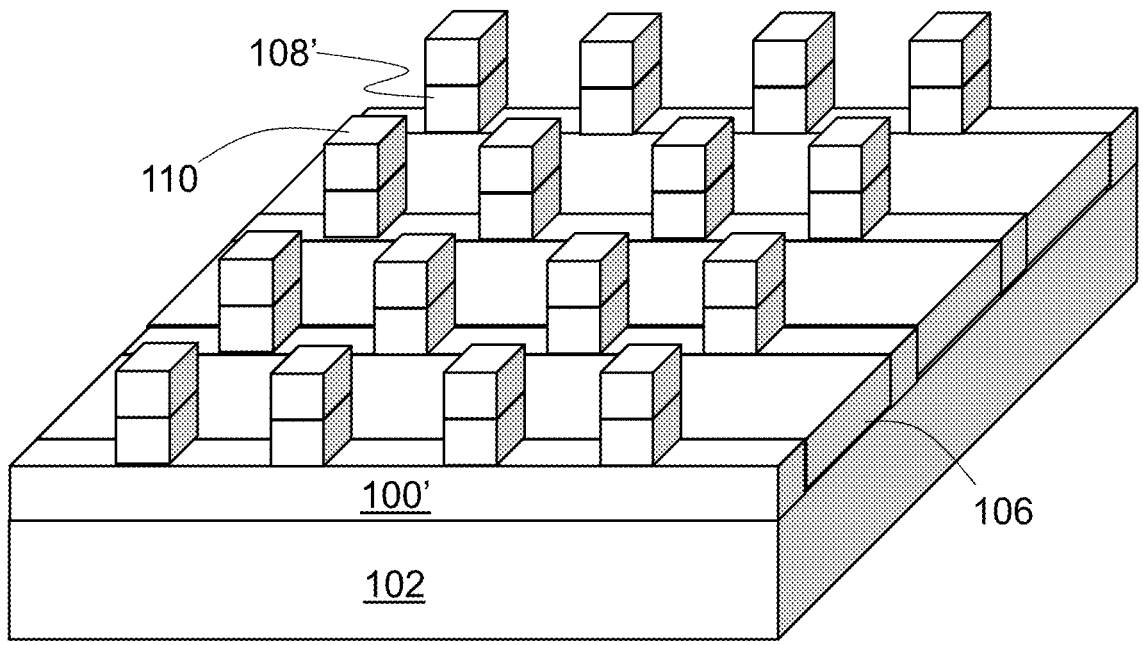
Figure 11:
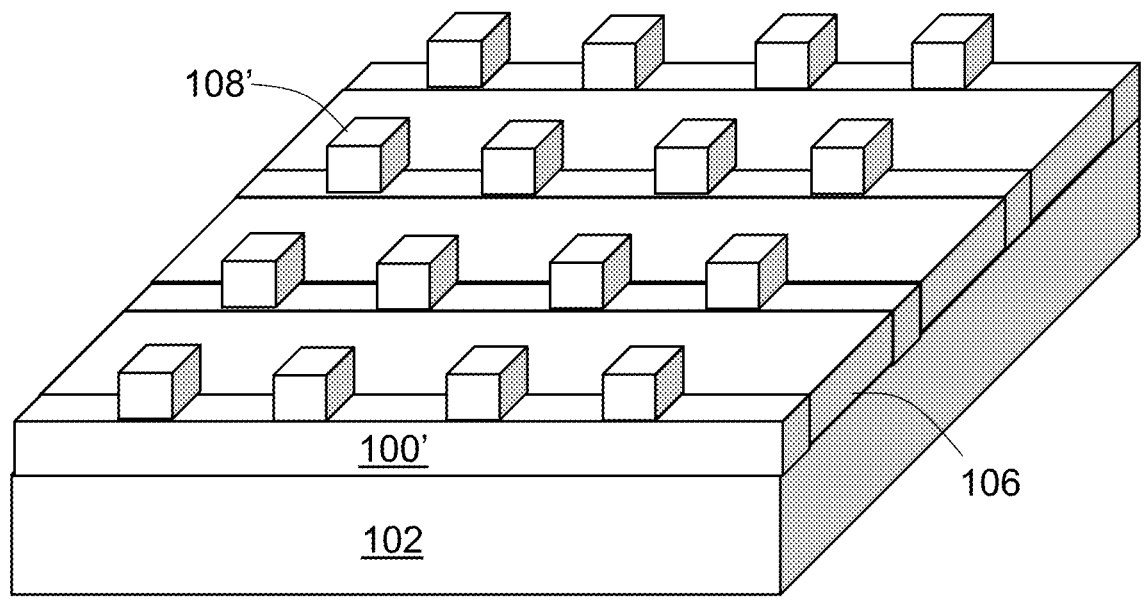

After the formation of the etch mask 110, the magnetic memory element film stack 108 is etched to remove portions of the magnetic memory element film stack 108 not covered by the etch mask 110 to form a plurality of magnetic memory elements 108' on top of the first conductive lines 100' as shown in FIG. 10. In embodiments where the intermediate contacts are used, the magnetic memory elements 108' are electrically connected to the first conductive lines 100' through the intermediate contacts. The etching process may be carried out by a plasma etching process (e.g., reactive ion etching) or an ion beam etching process or a combination of both. After the etching process, the etch mask 110 is removed from the top of the magnetic memory elements 108' as shown in FIG. 11.

Figure 12:
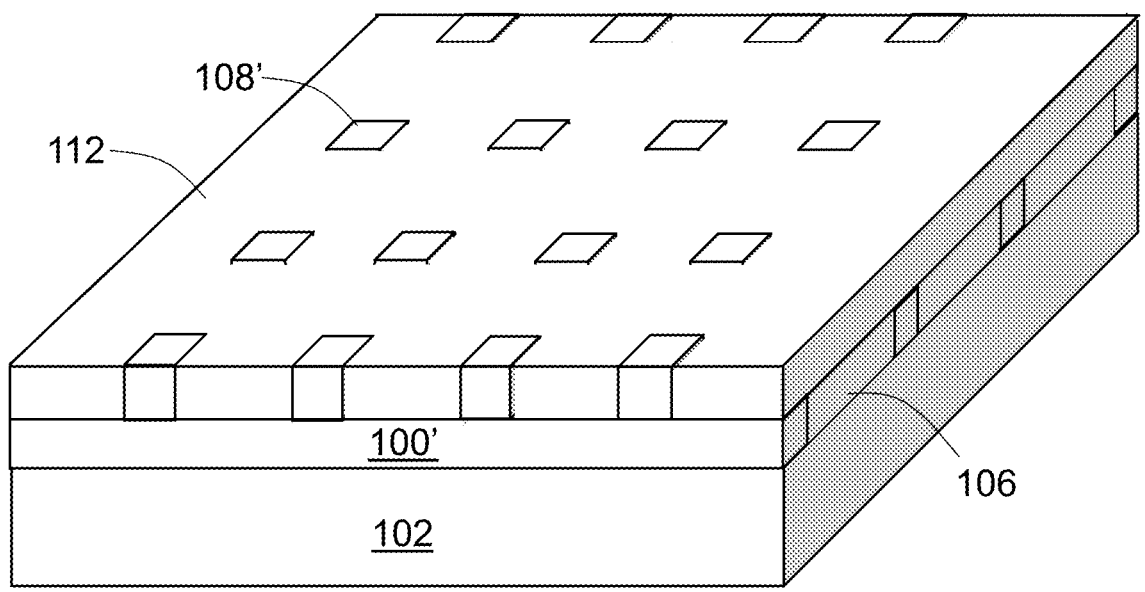

After the formation of the magnetic memory elements 108', a second dielectric material is deposited, and followed by a planarization process to remove excess second dielectric material above the magnetic memory elements 108' to form a second interlayer dielectric (ILD) 112 as shown in FIG. 12. The deposition of the second dielectric material may be carried out by a PVD or CVD process. The planarization process may be carried out by chemical mechanical polishing (CMP).

Figure 13:
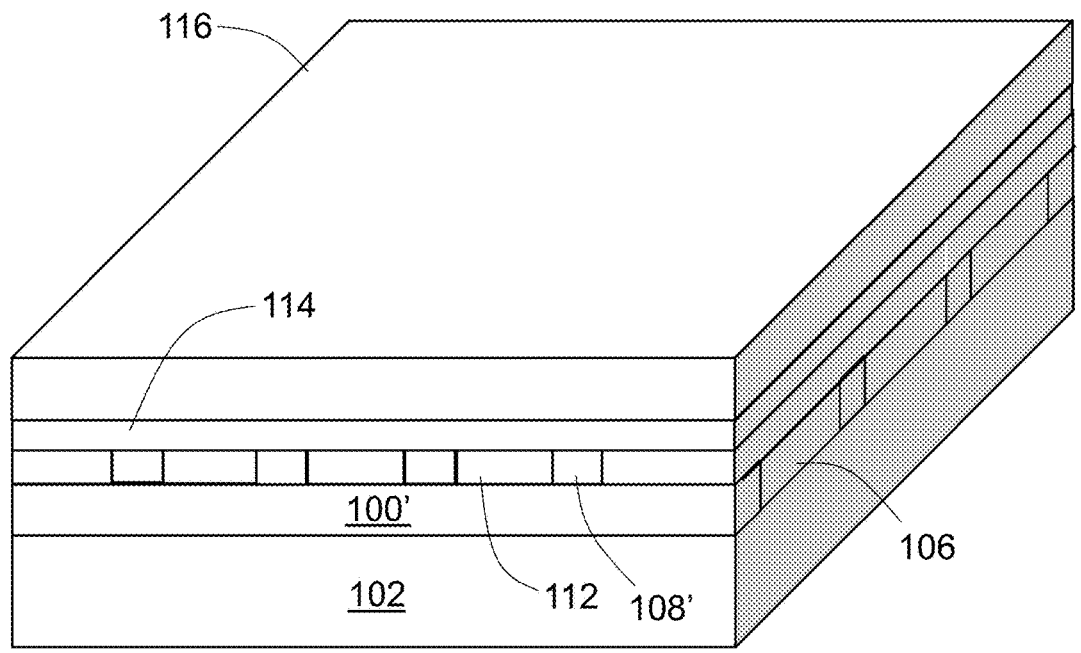
Figure 14A:
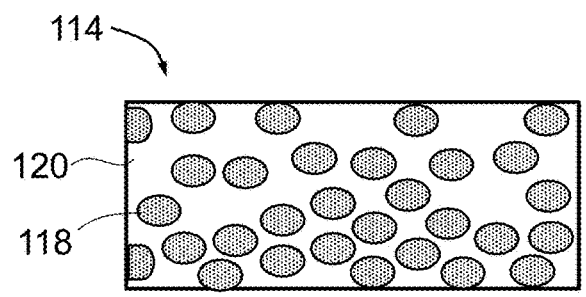
FIGS. 14A and 14B are cross-sectional views of volatile switching layer in accordance with embodiments of the present invention.

After the planarization process, a volatile switching film layer 114 for selector is deposited on top of the magnetic memory elements 108' and the second ILD 112; and a conductive film stack 116 is deposited on top of the volatile switching film layer 114 as shown in FIG. 13. The volatile switching film layer 114 may be made of a nominally insulating material or any suitable material that switches its resistance in the presence of an applied field or current, such as but not limited to $S_{iOx}$, $SiN_x$, $AlO_x$, $MgO_x$, $TaO_x$, $VO_x$, $NbO_x$, $TaO_x$, $TiO_x$, $WO_x$, $HfO_x$, $ZrO_x$, $NiO_x$, $FeO_x$, $YO_x$, $EuO_x$, $CuGe_xS_y$, $CuAg_xGe_yS_z$, $GeSb_xTe_y$, $AgIn_xSb_yTe_z$, $GeTe_x$, $SbTe_x$, $GeSb_x$, $CrO_x$, $SrTi_xO_y$, or any combination thereof. The nominally insulating switching film layer 114 may further include one or more metallic dopants, such as but not limited to Ag, Au, Zn, and Cu. Alternatively, the volatile switching film layer 114 may comprise a plurality of metal-rich clusters 118 embedded in a nominally semiconducting or insulating matrix 120 as illustrated in FIG. 14A. The matrix 120 of the volatile switching film layer 114 may be made of a suitable stoichiometric or near-stoichiometric insulator compound, or a suitable non-stoichiometric insulator compound, or a suitable chalcogenide, or a suitable solid electrolyte, or any combination thereof. Examples of the suitable stoichiometric or near-stoichiometric insulator compound include silicon oxide ($SiO_2$), silicon nitride ($Si_3N_4$), aluminum oxide ($Al_2O_3$), magnesium oxide (MgO), tantalum oxide ($Ta_2O_5$), vanadium oxide ($V_2O_5$), niobium oxide ($Nb_2O_5$), titanium oxide ($TiO_2$), tungsten oxide ($WO_3$), hafnium oxide ($HfO_2$), zirconium oxide ($ZrO_2$), nickel oxides (NiO, $Ni_2O_3$), iron oxide ($Fe_2O_3$), yttrium oxide ($Y_2O_3$), europium oxide ($Eu_2O_3$), and any combinations thereof. Examples of the suitable non-stoichiometric oxide include $SiO_x$, $VO_x$, $NbO_x$, $TaO_x$, $TiO_x$, $WO_x$, $HfO_x$, $ZrO_x$, $NiO_x$, $YO_x$, $EuO_x$, and any combinations thereof. Examples of the suitable chalcogenide include GeTe, $Sb_2Te_3$, GeSb, $Ge_2Sb_2Te_5$, $GeSbTe_2$, $Sb_3Te_7$, and any combinations thereof. The suitable solid electrolyte for the matrix 120 may comprise one or more of the following elements: Ge, Sb, S, Se, In, Ga, Sn, As, and Te.

With continuing reference to FIG. 14A, the plurality of metal-rich clusters 118 may be made of a noble metal, or an alloy including one or more noble metals, or a fast electric field enhanced diffuser material, or any combination thereof. Examples of the noble metal include gold (Au), silver (Ag), platinum (Pt), palladium (Pd), rhodium (Rh), iridium (Ir), ruthenium (Ru), osmium (Os), and rhenium (Re). Examples of the fast electric field enhanced diffuser material include nickel (Ni), copper (Cu), silver (Ag), gold (Au), zinc (Zn), cobalt (Co), iron (Fe), tungsten (W), molybdenum (Mo), tantalum (Ta), niobium (Nb), aluminum (Al), titanium (Ti), zirconium (Zr), titanium nitride (TiN), zirconium nitride (ZrN), tantalum nitride (TaN), niobium nitride (NbN), and tungsten nitride (WN).

Figure 14B:
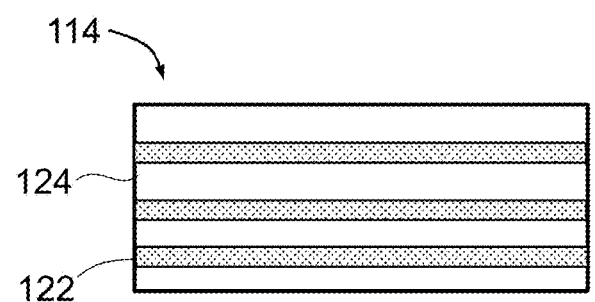

Still alternatively, the volatile switching film layer 114 may comprise one or more layers of a conductive material 122 interleaved with two or more layers of a nominally semi-conducting or insulating material 124 as illustrated in FIG. 14B. The conductive layers 122 may be made of any of the suitable conductive materials described above for the metal-rich clusters 118. The thickness of the conductive layers 122 may range from several angstroms to several nanometers. In some cases where the conductive layers 122 are extremely thin, one or more of the conductive layers 122 may be punctured by holes, thereby rendering the layer coverage to be discontinuous in some regions. Similarly, the nominally semi-conducting or insulating layers 124 may be made of any of the suitable semi-conducting or insulating materials described above for the matrix 120.

Referring back to FIG. 13, the conductive film stack 116 includes one or more conductive film layers that serve as the top electrode for selector and a conductive film layer that is subsequently patterned into second conductive lines on top of the film layers for the top electrode. Each of the one or more conductive film layers for the top electrode may be deposited by PVD or CVD and may be made of a suitable conductor, such as but not limited to Cu, $CuGe_x$, Ni, Ag, Pt, Pd, Cr, Co, Fe, Al, Au, Ir, Ru, Ti, $TiN_x$, Ta, $TaN_x$, W, $WN_x$, Mo, $MoN_x$, Zr, $ZrN_x$, Hf, $HfN_x$, Nb, $NbN_x$, Zn, or any combination thereof. For example and without limitation, the top electrode film structure may comprise a layer of $TiN_x$ and a layer of Ag formed thereon. The conductive film layer for the second conductive lines may be deposited by a physical vapor deposition (PVD) process (e.g., sputtering) or a chemical vapor deposition (CVD) process (e.g., plasma enhanced CVD, atomic layer deposition) and may be made of any suitable conductor, such as but not limited to tungsten (W), titanium nitride ($TiN_x$), aluminum (Al), tantalum (Ta), tantalum nitride ($TaN_x$), copper nitride ($CuN_x$), ruthenium (Ru), copper (Cu) or any combination thereof.

Figure 15:
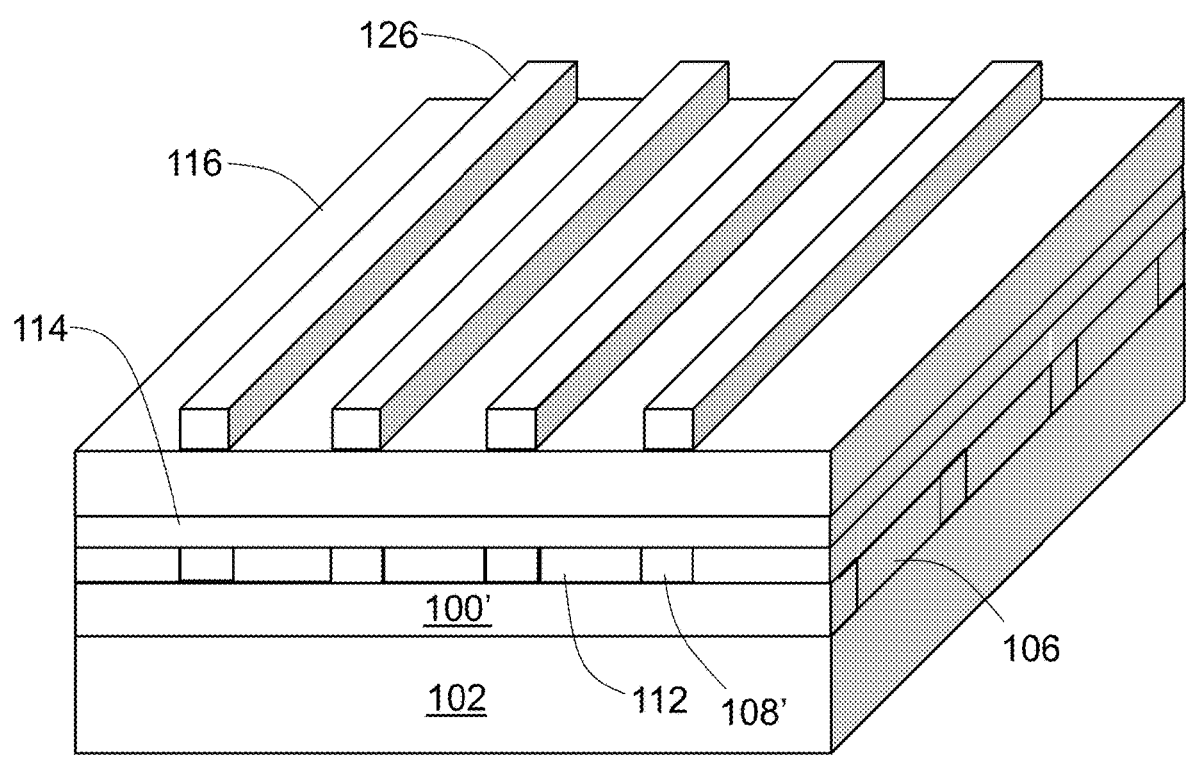

The process continues by forming an etch mask 126 comprising a plurality of parallel lines on top of the conductive film stack 116 as illustrated in FIG. 15. The plurality of lines of the etch mask 126 are aligned to the magnetic memory elements 108' underneath along a second direction that is substantially perpendicular to the first direction of the first conductive lines 100'. In an embodiment, the width of the lines of the etch mask 126 (i.e., dimension along the first direction) is substantially larger than the dimension of the magnetic memory elements 108' along the first direction. The etch mask 126 may include one or more layers of mask materials, such as but not limited to photoresist, silicon oxide ($SiO_x$), silicon nitride ($SiN_x$), silicon oxynitride ($Si_xN_y$), silicon carbide ($SiC_x$), tantalum (Ta), tantalum nitride ($TaN_x$), tungsten (W), titanium nitride ($TiN_x$), and any combinations thereof. The etch mask 126 may be formed by photolithography or a combination of photolithography and etching.

Figure 16:
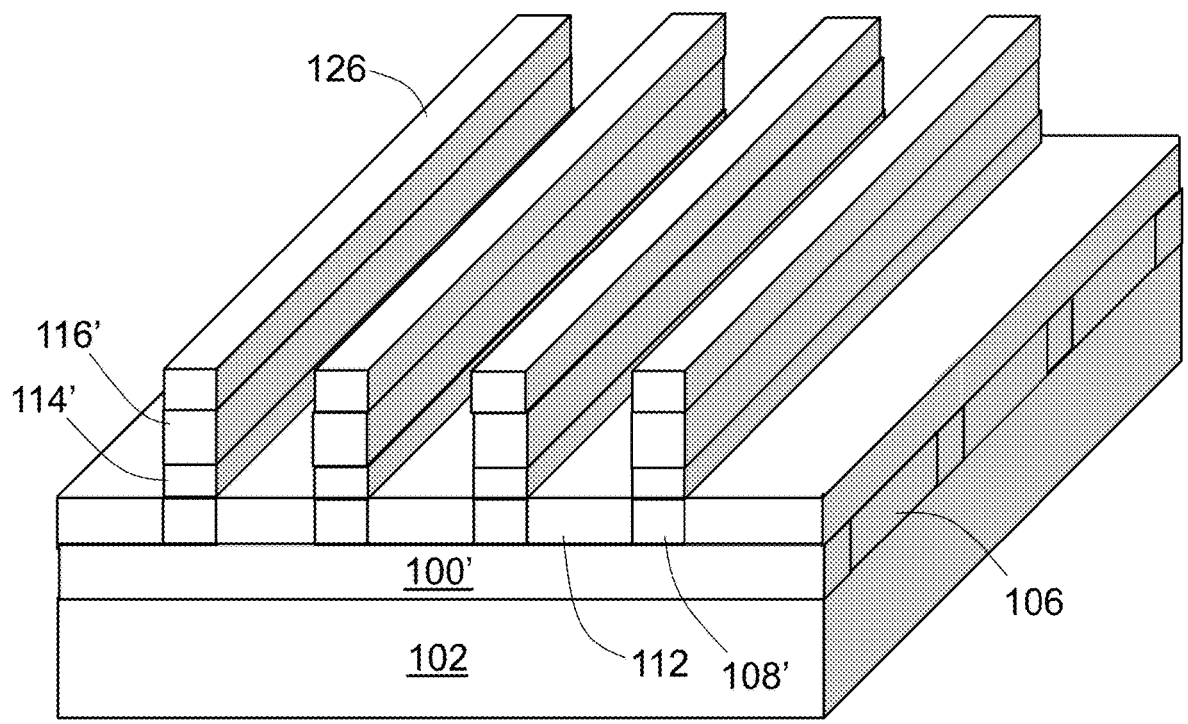

After formation of the etch mask 126 on top of the conductive film stack 116, the conductive film stack 116 and the volatile switching film layer 114 are etched to remove portions that are not covered by the etch mask 126 to form a plurality of composite lines, each of which connects to a row of the magnetic memory elements 108' along the second direction, as shown in FIG. 16. Each of the composite lines includes a volatile switching layer 114' formed on top of a row of the magnetic memory elements 108' and a conductive layer structure 116' formed on top of the volatile switching layer 114'. The conductive layer structure 116' includes one or more conductive layers that function as the top electrode for selector and another conductive layer formed thereon that functions as a second conductive line. The etch mask 126 is removed after etching as shown in FIG. 17.

Figure 18:
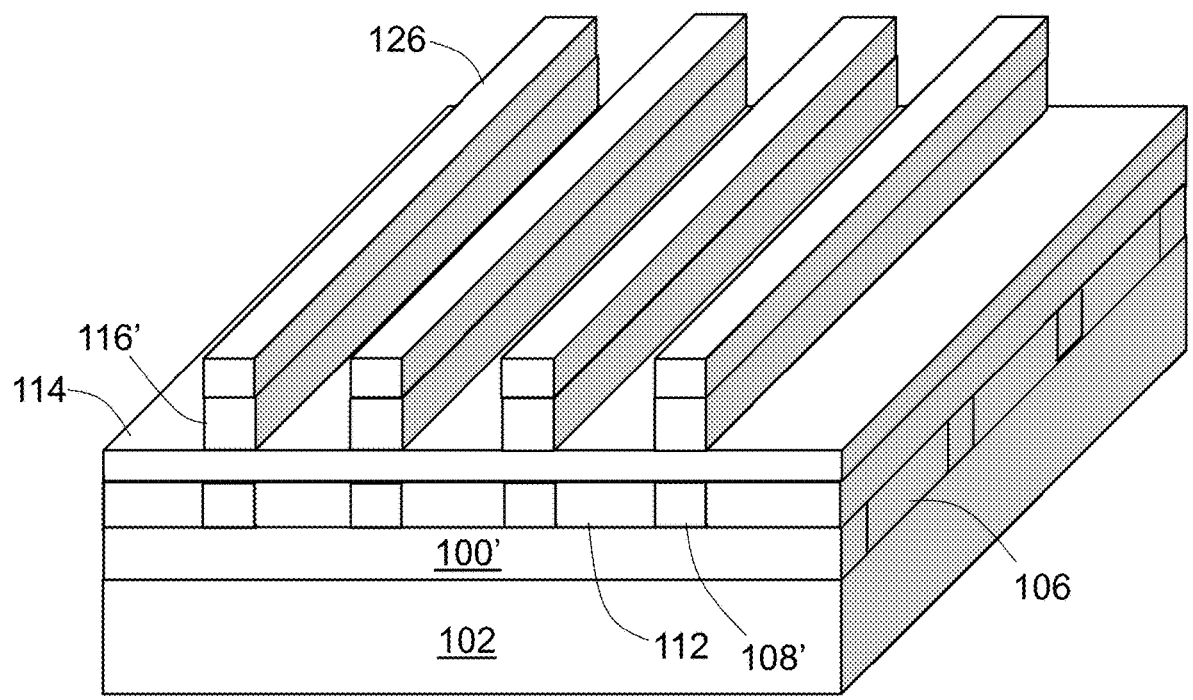
FIGS. 18 and 19 are perspective views illustrating final stages in formation of an array of memory cells in accordance with another embodiment of the present invention.

Following the formation of the etch mask 126 as shown in FIG. 15, the process may alternatively proceed by etching the conductive film stack 116 while leaving the volatile switching film layer 114 mostly intact as shown in FIG. 18. The etch mask 126 is removed after etching as shown in FIG. 19.

Figure 17:
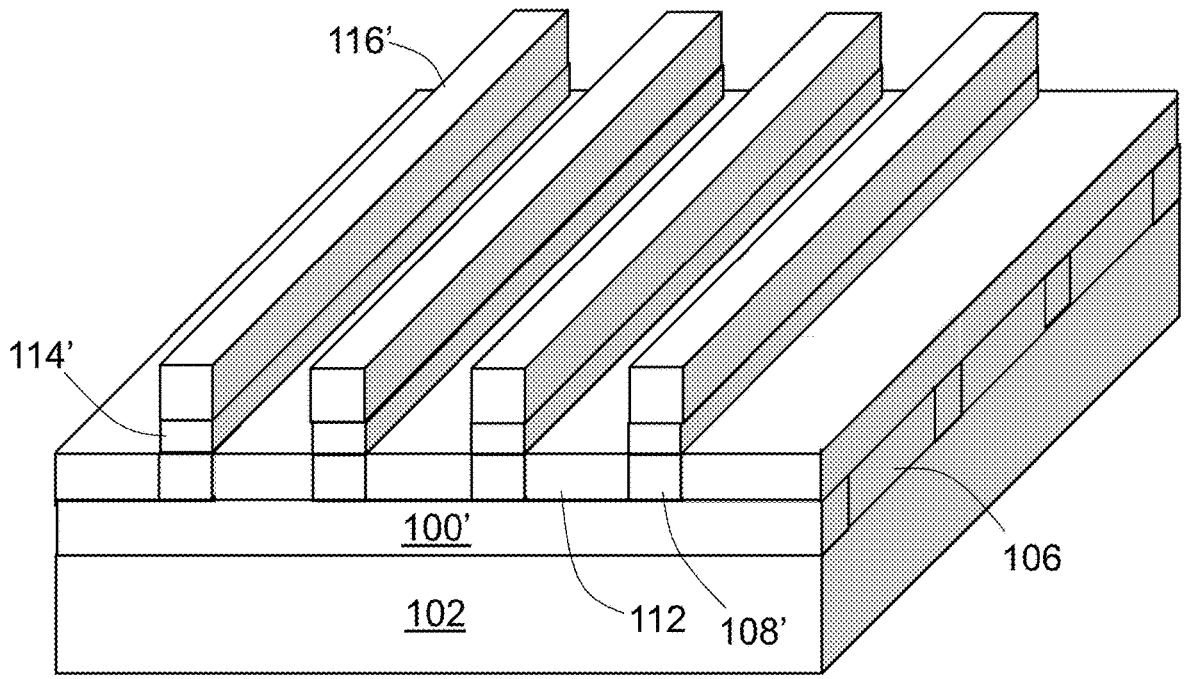
Figure 19:
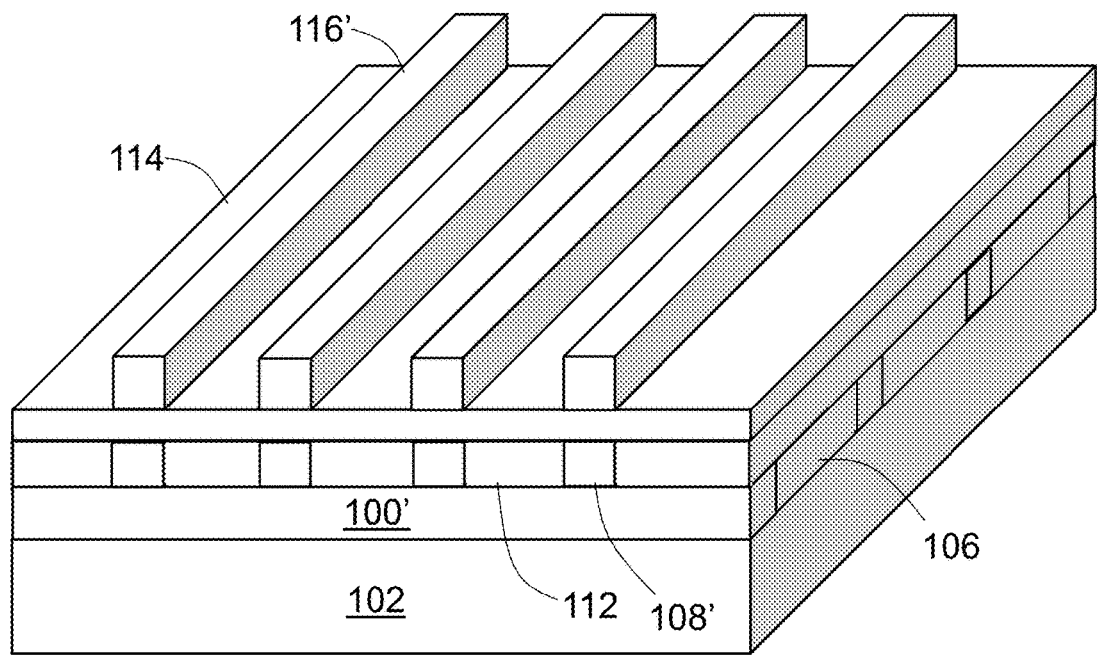
Figure 20:
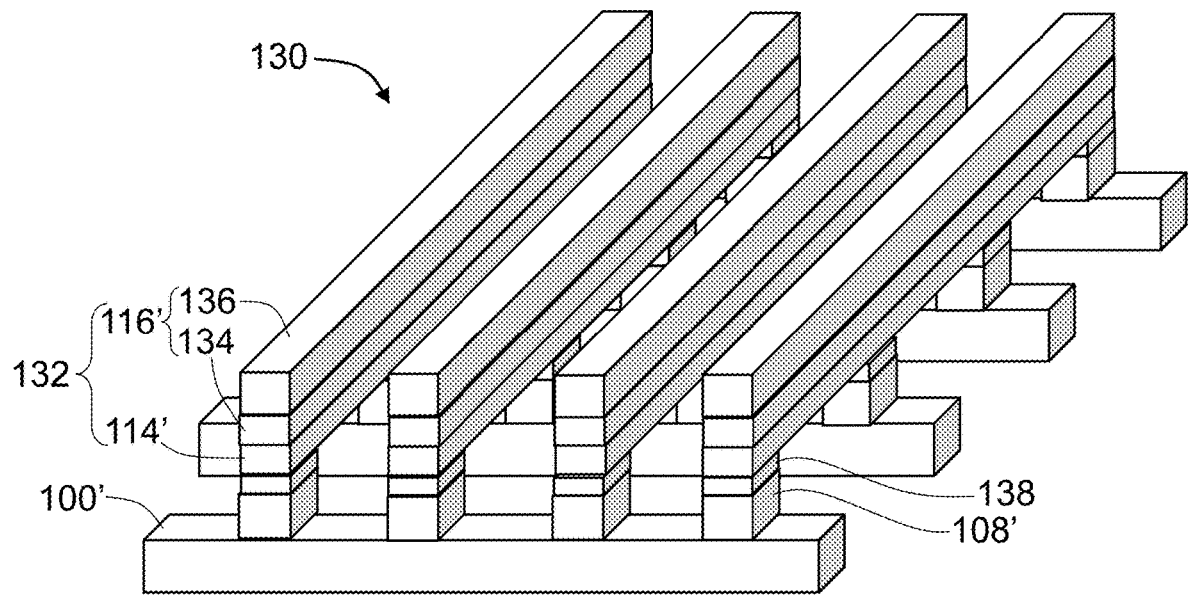
FIG. 20 is a perspective view of the array of memory cells corresponding to the embodiment of FIG. 18.
Figure 21:
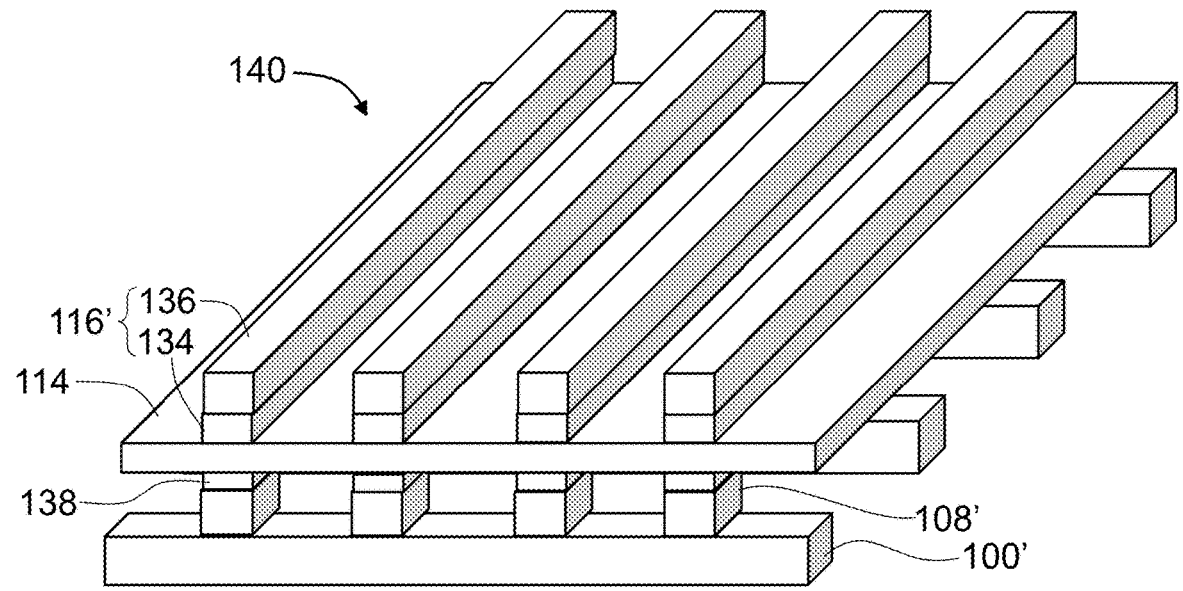
FIG. 21 is a perspective view of the array of memory cells corresponding to the embodiment of FIG. 19.

FIGS. 20 and 21 are perspective views corresponding to the memory array embodiments of FIGS. 17 and 19, respectively. For reasons of clarity, the substrate 102 and the ILDs 106 and 112 are omitted in the drawings to illustrate the structures. Referring now to FIG. 20, the memory array 130 includes a plurality of magnetic memory elements 108' arranged in rows and columns; a plurality of first conductive lines 100', each of which is connected to a respective row of the plurality of magnetic memory elements 108' along a row direction; and a plurality of composite lines 132 extending along a column direction that is substantially perpendicular to the row direction. Each of the plurality of composite lines 132 includes a volatile switching layer 114' connected to a respective column of the plurality of magnetic memory elements 108' along the column direction, a top electrode layer 134 formed adjacent to the volatile switching layer 114', and a second conductive line 136 formed adjacent to the electrode layer 134. The memory array 130 may further include a plurality of bottom electrodes 138, each of which is formed between a respective one of the magnetic memory elements 108' and a respective one of the composite lines 132. The plurality of bottom electrodes 138, if present, may be formed together with the magnetic memory elements 108' at the etching step illustrated in FIG. 10 and described above.

Referring now to FIG. 21, the memory array 140 is similar to the memory array 130 of FIG. 20 except that the volatile switching film layer 114 is shared by all memory cells in the array, not just memory cells along the column direction. The memory array 140 includes a plurality of magnetic memory elements 108' arranged in rows and columns; a plurality of first conductive lines 100', each of which is connected to a respective row of the plurality of magnetic memory elements 108' along a row direction; a sheet of volatile switching film layer 114 formed adjacent to the plurality of magnetic memory elements 108'; and a plurality of composite lines 116' extending along a column direction that is substantially perpendicular to the row direction. Each of the plurality of composite lines 116' includes a top electrode layer 134 formed adjacent to the volatile switching film layer 114 and aligned to a respective column of the magnetic memory elements 108' along the column direction; and a second conductive line 136 formed adjacent to the electrode layer 134. The memory array 140 may further include a plurality of bottom electrodes 138, each of which is formed between a respective one of the magnetic memory elements 108' and the volatile switching film layer 114.

Referring back to FIG. 20, each memory cell of the memory array 130 includes a magnetic memory element 108' coupled to a selector in series. The bottom electrode 138 and portions of the volatile switching layer 114' and the top electrode layer 134 above the magnetic memory element 108' collectively form a selector. When a threshold voltage is applied across a memory cell through a first conductive line and a second conductive line, one or more conductive paths or filaments may form locally in the volatile switching layer 114' at the cross point between the first and second conductive lines. Since the formation of conductive paths or filaments in the volatile switching layer 114' is localized to the vicinity of the cross point where the electric field is strongest, multiple memory cells along the column direction may share a same volatile switching layer 114' without creating parasitic leakage paths. Similarly, multiple memory cells in the array along both the row and column directions may share a same volatile switching film layer 114 as shown in FIG. 21 without creating parasitic leakage paths.

Figure 22:
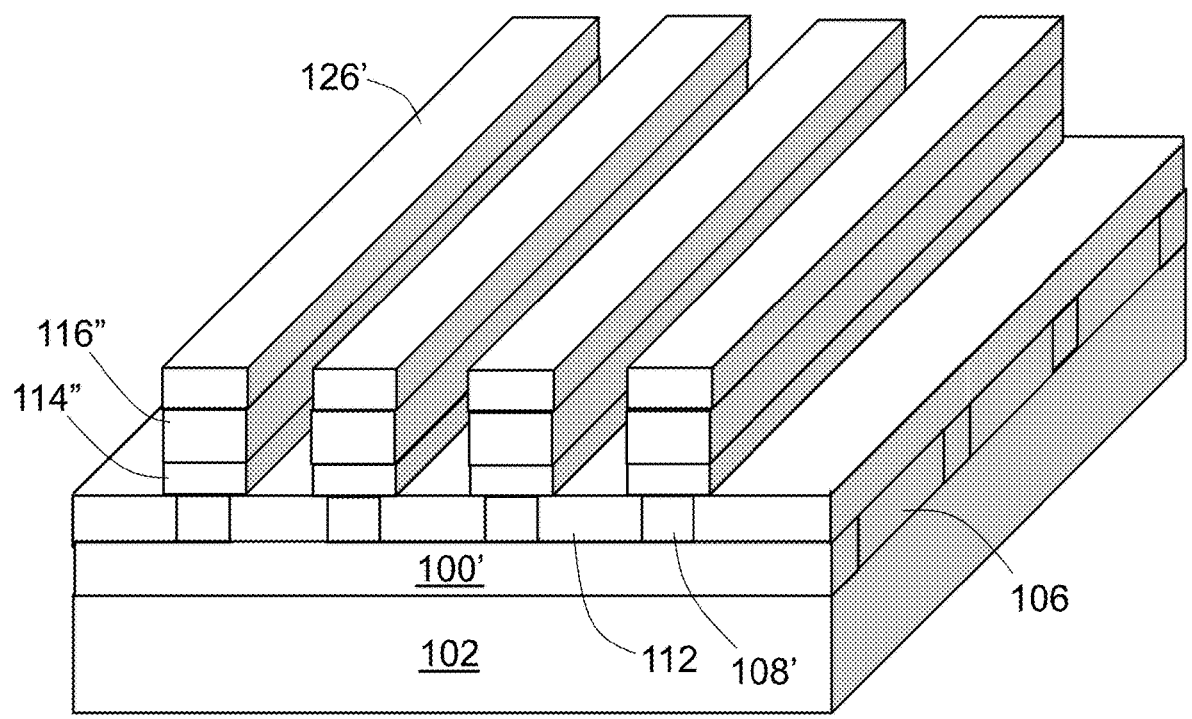
FIG. 22 is a perspective view illustrating a stage in formation of an array of memory cells in accordance with still another embodiment of the present invention.

Compared with prior art cross-point memory structures, in which the selector and the memory element are etched using the same etch mask, the present invention minimizes (i.e., FIG. 20) or eliminates (i.e., FIG. 21) the exposure of the sidewall of the volatile switching layer 114' to the etching environment, thereby improving the device yield. Moreover, in embodiments where the width of the lines of the etch mask 126' is substantially larger than the dimension of the magnetic memory elements 108' along the row direction as shown in FIG. 22, the accumulation of redeposited materials, if any, on the sidewall of the volatile switching layer 114" would not cause shunting because the sidewall is not in contact with the magnetic memory elements 108'. The invention also provides the flexibility of allowing the volatile switching layer 114' to be etched using a different process or chemistry from the magnetic memory element 108'. For example and without limitation, the magnetic memory element 108' may be etched using ion beam etching (IBE), while the volatile switching layer 114' may be etched using reactive ion etching (RIE).

The previously described embodiments of the present invention have many advantages, including improved device yield and flexible process conditions. It is important to note, however, that the invention does not require that all the advantageous features and all the advantages need to be incorporated into every embodiment of the present invention.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

Any element in a claim that does not explicitly state "means for" performing a specified function, or "step for" performing a specific function, is not to be interpreted as a "means" or "step" clause as specified in 35 U.S.C. § 112, ¶6. In particular, the use of "step of" in the claims herein is not intended to invoke the provisions of 35 U.S.C. § 112, ¶6.

What is claimed is:

1. A magnetic memory array comprising:
   an array of magnetic memory elements arranged in rows and columns;
   a plurality of first conductive lines formed beneath the array of magnetic memory elements, each of the plurality of first conductive lines connected to a respective row of the array of magnetic memory elements along a row direction; and
   a plurality of composite lines formed above the array of magnetic memory elements, each of the plurality of composite lines including a volatile switching layer connected to a respective column of the array of magnetic memory elements along a column direction and an electrode layer formed on top of the volatile switching layer.

2. The memory array of claim 1, further comprising a plurality of electrodes, each of which is formed between a respective one of the array of magnetic memory elements and a respective one of the volatile switching layers.

3. The memory array of claim 1, wherein each of the array of magnetic memory elements includes two magnetic layers with an insulating tunnel junction layer interposed therebetween.

4. The memory array of claim 1, wherein a dimension of the volatile switching layer along the row direction is substantially larger than a dimension of one of the array of magnetic memory elements along the row direction.

5. The memory array of claim 1, wherein each of the plurality of composite lines further includes a second conductive line formed on top of the electrode layer.

6. The memory array of claim 1, wherein a current path through one of the array of magnetic memory elements at a cross point between a respective one the plurality of first conductive lines and a respective one of the plurality of composite lines is substantially perpendicular to the row and column directions.

7. A magnetic memory array comprising:
   an array of magnetic memory elements arranged in rows and columns;
   a plurality of first conductive lines formed beneath the array of magnetic memory elements, each of the plurality of first conductive lines connected to a respective row of the array of magnetic memory elements along a row direction;
   a sheet of volatile switching layer formed on top of the array of magnetic memory elements and covering the array of magnetic memory elements along the row direction and a column direction; and
   a plurality of electrode lines formed on top of the sheet of volatile switching layer, each of the plurality of electrode lines aligned to a respective column of the array of magnetic memory elements along the column direction.

8. The memory array of claim 7, further comprising a plurality of electrodes, each of which is formed between a respective one of the array of magnetic memory elements and the sheet of volatile switching layer.

9. The memory array of claim 7, wherein each of the array of magnetic memory elements includes two magnetic layers with an insulating tunnel junction layer interposed therebetween.

10. The memory array of claim 7 further comprising a plurality of second conductive lines formed on top of the plurality of electrode lines.

11. The memory array of claim 7, wherein a current path through one of the array of magnetic memory elements at a cross point between a respective one of the plurality of first conductive lines and a respective one the plurality of electrode lines is substantially perpendicular to the row and column directions.

* * * * *